United States Patent
Haruhana et al.

(10) Patent No.: US 8,786,370 B2
(45) Date of Patent: Jul. 22, 2014

(54) POWER SUPPLY CONTROL CIRCUIT

(75) Inventors: Hideyo Haruhana, Hamamatsu (JP);
Takayuki Yoshida, Hamamatsu (JP);
Hidekazu Ono, Hamamatsu (JP);
Tatsuya Kishii, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 87 days.

(21) Appl. No.: 13/489,902

(22) Filed: Jun. 6, 2012

(65) Prior Publication Data

US 2012/0313610 A1     Dec. 13, 2012

(30) Foreign Application Priority Data

Jun. 8, 2011   (JP) .................................. 2011-127964

(51) Int. Cl.
*H03F 3/04* (2006.01)

(52) U.S. Cl.
USPC ......................................... 330/297; 330/127

(58) Field of Classification Search
USPC ........................ 330/296–297, 279, 134, 127
See application file for complete search history.

(56) References Cited

U.S. PATENT DOCUMENTS

| | | | |
|---|---|---|---|
| 4,339,730 A | | 7/1982 | Yokoyama |
| 6,215,356 B1 | | 4/2001 | Servaes et al. |
| 7,808,324 B1 * | | 10/2010 | Woodford et al. ............ 330/297 |
| 8,436,683 B2 * | | 5/2013 | Gehrke ......................... 330/297 |

FOREIGN PATENT DOCUMENTS

| | | |
|---|---|---|
| JP | 56-20314 A | 2/1981 |
| JP | 8-111615 A | 4/1996 |
| JP | 10-335944 A | 12/1998 |
| JP | 2000-223966 A | 8/2000 |

OTHER PUBLICATIONS

Japanese Office Action with English Translation dated Jun. 4, 2013 (six (6) pages).
Korean Office Action with English translation dated Aug. 28, 2013 (Seven (7) pages).

* cited by examiner

*Primary Examiner* — Hieu Nguyen
(74) *Attorney, Agent, or Firm* — Crowell & Moring LLP

(57) ABSTRACT

A power supply control circuit includes a mode controlling unit which, in accordance with an output voltage of an amplifying section, performs a mode up for switching a current power supply voltage of the amplifying section to a higher power supply voltage being higher than the current power supply voltage, and which, in a case where a magnitude of the output voltage of the amplifying section is smaller than a threshold voltage for a predetermined time period or longer, performs a mode down for switching the power supply voltage of the amplifying section to a lower power supply voltage being lower than the current power supply voltage, and a threshold setting unit which sets the threshold voltage based on the output voltage of the amplifying section at a timing when the mode up is performed.

7 Claims, 5 Drawing Sheets

PRIOR ART

POWER SUPPLY CONTROL CIRCUIT

BACKGROUND

The present invention relates to a power supply control circuit which is preferably used for controlling a power supply voltage for a class-G amplifier.

An amplifier consumes an electric power which is equal to the product of a load current which flows through a load, and a difference between a power supply voltage given to the amplifier and an output voltage which is supplied from the amplifier to the load. In order to reduce the power consumption of a whole apparatus including an amplifier and a load, the power consumption which is caused in the amplifier itself must be suppressed as low as possible. As an amplifier which satisfies such a request, a class-G amplifier is known in which a power supply voltage for an amplification operation is switched in accordance with the amplitude of an input signal or an output signal (for example, see JP-A-2000-223966).

FIG. 5 is a circuit diagram showing an example of the configuration of a class-G amplifier of this kind. In the example, the class-G amplifier has an amplifying section 1, a charge pump 2, and a power supply control circuit 3. Here, the amplifying section 1 is a power amplifier such as a headphone amplifier, and amplifies an input voltage VIN to generate an output voltage VOUT for driving a load 1A such as a speaker. The charge pump 2 is a power supply which boosts a predetermined power supply voltage to generate a positive power supply voltage +VB and a negative power supply voltage −VB, and which supplies the voltages to the amplifying section 1. The boost mode of the charge pump 2 includes a middle power mode where positive and negative power supply voltages +VDD, −VDD of a predetermined magnitude are generated as the positive and negative power supply voltages +VB, −VB, and a low power mode where positive and negative power supply voltages +VDD/2, −VDD/2 of a magnitude which is a half of that in the middle power mode. The power supply control circuit 3 monitors the output voltage VOUT of the amplifying section 1, and the positive and negative power supply voltages +VB, −VB for the amplifying section 1, and, based on a result of the monitoring, executes a mode up in which the boost mode of the charge pump 2 is switched from the low power mode to the middle power mode, or a mode down in which the boost mode is switched from the middle power mode to the low power mode.

The power supply control circuit 3 will be described in further detail. In a state where the charge pump 2 operates in the low power mode, when the peak value of the output voltage VOUT of the amplifying section 1 and the positive and negative power supply voltages +VB, −VB approach each other with exceeding a predetermined limit value, the power supply control circuit 3 changes the mode of the charge pump 2 from the low power mode to the middle power mode (the mode up), in order to prevent waveform distortion from occurring in the output voltage VOUT. In a state where the charge pump 2 operates in the middle power mode, when the state where the absolute value of the output voltage VOUT of the amplifying section 1 is lower than a predetermined threshold voltage continues for a predetermined time period or longer, the power supply control circuit 3 changes the mode of the charge pump 2 from the middle power mode to the low power mode (the mode down), in order to reduce the power consumption of the amplifying section 1 itself. As described above, the magnitudes of the positive and negative power supply voltages +VB, −VB which are supplied from the charge pump 2 to the amplifying section 1 are switched in accordance with the magnitude of the output voltage VOUT of the amplifying section 1. Therefore, the power consumption of the amplifying section 1 itself can be reduced while preventing waveform distortion from occurring in the output voltage VOUT of the amplifying section 1.

In the above-described related class-G amplifier, in the case where conditions for the mode down are loose, specifically, in the case where, when the mode down is to be performed under conditions that the state where the absolute value of the output voltage VOUT is smaller than the predetermined threshold voltage continues for the predetermined time period or longer, the threshold voltage is high, the mode down is easily performed after the mode up, and a phenomenon in which the mode up and the mode down are alternately repeated occurs. When such mode switching occurs frequently, noises are frequently produced in the output voltage VOUT of the amplifying section 1. In the related technique, while considering production dispersions among elements constituting the class-G amplifier, the range of the load current of the load 1A, and the like, therefore, conditions for the mode down are sufficiently strictly set so that the above-described frequent mode switching does not occur even under the worst conditions. That means, the threshold voltage is low when the mode down is to be performed under conditions that the state where the absolute value of the output voltage VOUT is smaller than the predetermined threshold voltage continues for the predetermined time period or longer. Because of the strict conditions for the mode down, however, there arises the following problem. Despite of the state where the absolute value of the output voltage VOUT of the amplifying section 1 is reduced in the middle power mode, and the switching to the low power mode is not problematic, the mode down is not performed for a long time period, thereby causing a problem in that waste power consumption occurs.

SUMMARY

The invention has been conducted in view of the above-discussed circumstances. It is an object of the invention to provide a power supply control circuit in which the mode down can be performed under optimum conditions in accordance with production dispersions of a class-G amplifier, the magnitude of the load, and the like, and waste power consumption can be suppressed from occurring.

The invention provides a power supply control circuit comprising:

a mode controlling unit which, in accordance with an output voltage of an amplifying section, performs a mode up for switching a current power supply voltage of the amplifying section to a higher power supply voltage being higher than the current power supply voltage, and which, in a case where a magnitude of the output voltage of the amplifying section is smaller than a threshold voltage for a predetermined time period or longer, performs a mode down for switching the current power supply voltage of the amplifying section to a lower power supply voltage being lower than the current power supply voltage; and a threshold setting unit which sets the threshold voltage based on the output voltage of the amplifying section at a timing when the mode up is performed.

According to the invention, the threshold voltage is set based on the output voltage of the amplifying section at the timing when the mode up is performed, and, in the case where the magnitude of the output voltage of the amplifying section is smaller than the threshold voltage for the predetermined time period or longer, the mode down is performed. Therefore, the mode down can be performed under optimum conditions where repetition of the mode up and the mode down can be avoided, and waste power consumption can be suppressed from occurring.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Hereinafter, an embodiment of the invention will be described with reference to the drawings.

Figure 1:
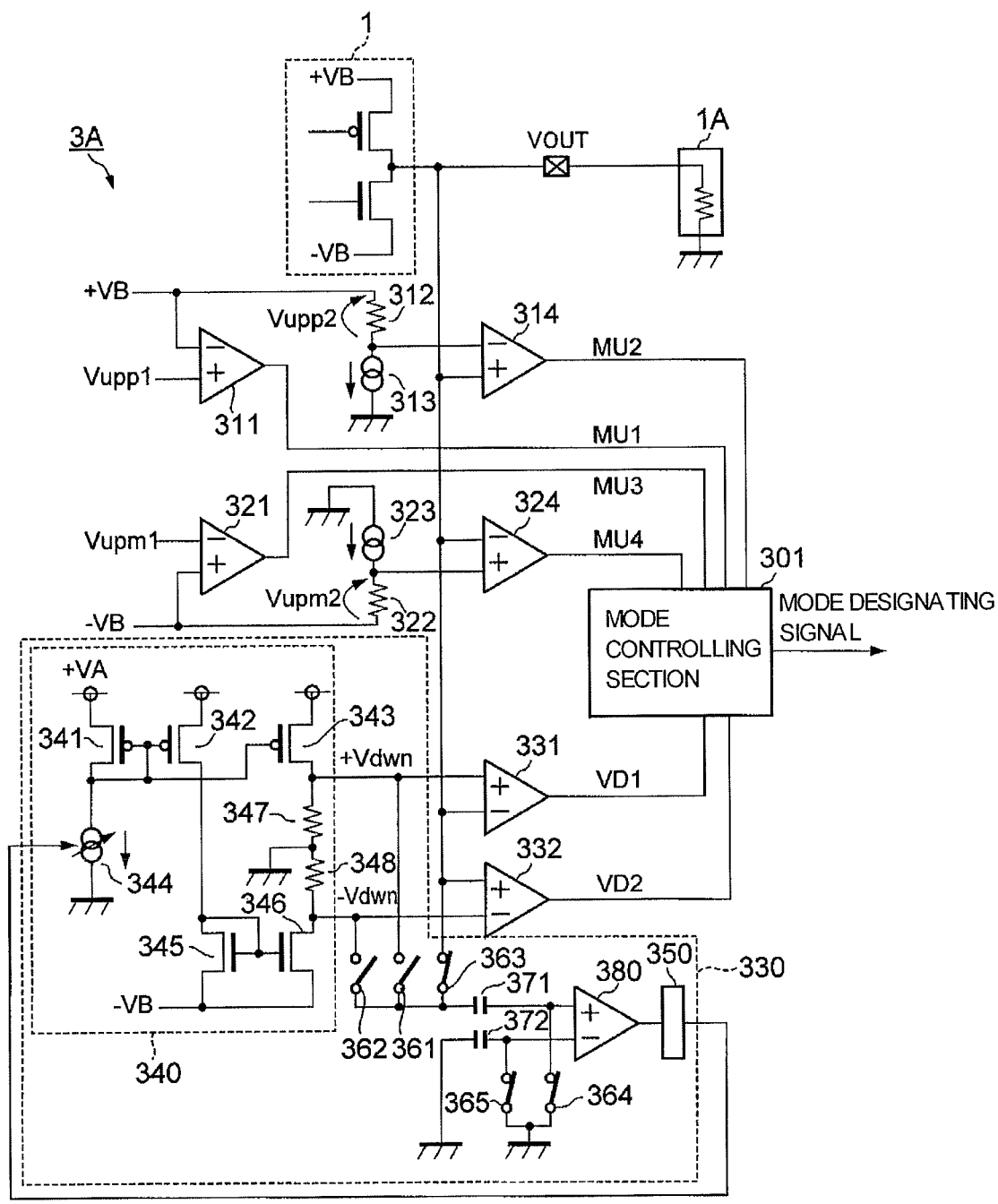
FIG. 1 is a circuit diagram showing the configuration of a power supply control circuit according to an embodiment of the invention.

FIG. 1 is a circuit diagram showing the configuration of a power supply control circuit 3A according to the embodiment of the invention. Similarly with the above-described power supply control circuit 3 of FIG. 5, the power supply control circuit 3A controls the boost mode of the charge pump 2 which supplies the power supply voltages +VB, −VB to the amplifying section 1. In FIG. 1, in order to facilitate understanding of the function of the power supply control circuit 3A, the amplifying section 1 and the load 1A in FIG. 5 are illustrated together with the power supply control circuit 3A.

Figure 5:
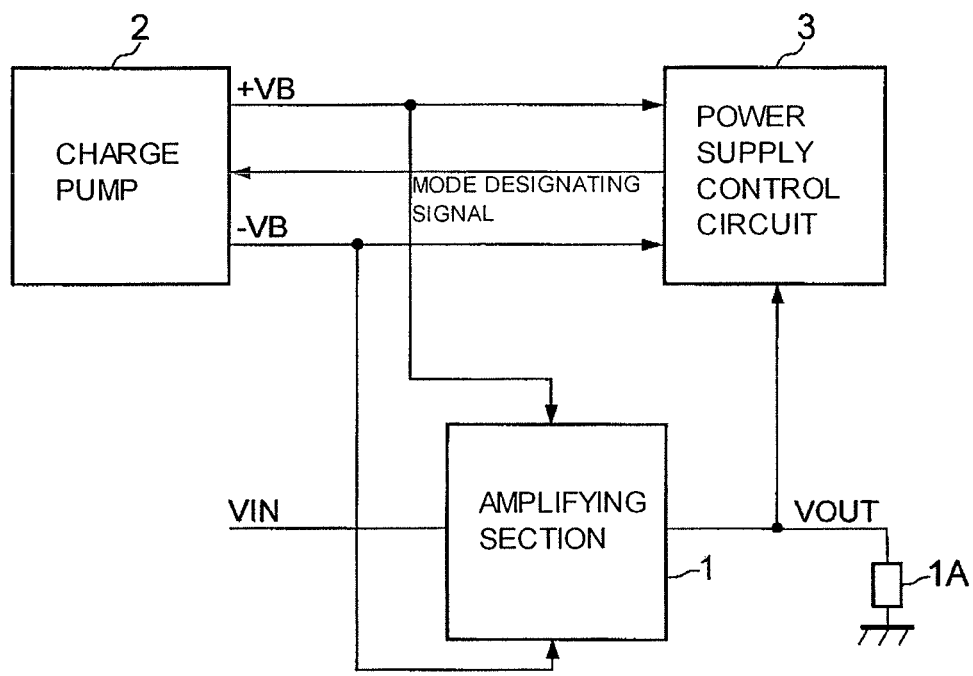
FIG. 5 is a circuit diagram showing an example of the configuration of a class-G amplifier.

In the power supply control circuit 3A shown in FIG. 1, a mode controlling section 301 is a circuit which monitors the output voltage VOUT of the amplifying section 1, and the positive and negative power supply voltages +VB, −VB for the amplifying section 1 of FIG. 5, and which, based on a result of the monitoring, generates a mode designating signal that designates the boost mode of the charge pump 2 of FIG. 5.

More specifically, in the case where the charge pump 2 operates in the low power mode, when it is detected that one of the following mode up conditions 1 to 4 is satisfied, the mode controlling section 301 outputs a mode designating signal which causes the charge pump 2 to transit to the middle power mode, thereby performing the mode up.

Mode up condition 1: the positive power supply voltage +VB is lower than a threshold voltage Vupp1;

Mode up condition 2: the margin (difference) |+VB−VOUT| of the output voltage VOUT with respect to the positive power supply voltage +VB is smaller than a threshold voltage Vupp2;

Mode up condition 3: the negative power supply voltage −VB is higher than a threshold voltage Vupm1; and Mode up condition 4: the margin (difference) |−VB−VOUT| of the output voltage VOUT with respect to the negative power supply voltage −VB is smaller than a threshold voltage Vupm2.

In the case where the amplifying section 1 outputs the positive output voltage VOUT, there is a possibility that the mode up conditions 1 and 2 are satisfied. In the case where the amplifying section 1 outputs the negative output voltage VOUT, there is a possibility that mode up conditions 3 and 4 are satisfied.

In the case where the charge pump 2 operates in the middle power mode, when it is detected that the following mode down condition is satisfied, the mode controlling section 301 outputs a mode designating signal which causes the charge pump 2 to transit to the low power mode, thereby performing the mode down.

Mode down condition: the absolute value of the output voltage VOUT continues to be lower than a predetermined threshold voltage Vdwn for a predetermined time period or longer.

Referring to FIG. 1, a comparator 311 compares the positive power supply voltage +VB with the threshold voltage Vupp1 supplied from a reference voltage source which is not shown, to determine whether mode up condition 1 is satisfied or not, and, in the case where mode up condition 1 is satisfied, sets a mode up signal MU1 to an active level. A resistor 312 and constant current source 313 which are connected in series to the positive power supply voltage +VB, and a comparator 314 constitute a circuit which, in the case where mode up condition 2 is satisfied, sets a mode up signal MU2 to an active level. More specifically, in the embodiment, the resistance of the resistor 312 and the current value of the constant current source 313 are determined so that a voltage drop corresponding to the threshold voltage Vupp2 is developed across the resistor 312. In the case where the relationship between the output voltage VOUT of the amplifying section 1 and the voltage +VB−Vupp2 of the node of the resistor 312 and the constant current source 313 is VOUT>+VB−Vupp2, i.e., in the case where Vupp2>|+VB−VOUT| and mode up condition 2 is satisfied, the comparator 314 sets the mode up signal MU2 to the active level.

A comparator 321 compares the negative power supply voltage −VB with the threshold voltage Vupm1 supplied from a reference voltage source which is not shown, to determine whether mode up condition 3 is satisfied or not, and, in the case where mode up condition 3 is satisfied, sets a mode up signal MU3 to an active level. A resistor 322 and a constant current source 323 which are connected in series to the negative power supply voltage −VB, and a comparator 324 constitute a circuit which, in the case where mode up condition 4 is satisfied, sets a mode up signal MU4 to an active level. More specifically, in the embodiment, the resistance of the resistor 322 and the current value of the constant current source 323 are determined so that a voltage drop corresponding to the threshold voltage Vupm2 is developed across the resistor 322. In the case where the relationship between the output voltage VOUT of the amplifying section 1 and the voltage −VB+Vupm2 of the node of the resistor 322 and the constant current source 323 is VOUT<−VB+Vupm2, i.e., in the case where Vupm2>|−VB−VOUT| and mode up condition 4 is satisfied, the comparator 324 sets the mode up signal MU4 to the active level.

In the case where the charge pump 2 operates in the low power mode, when one of the above-described mode up signals MU1, MU2, MU3, MU4 is set to the active level, the mode controlling section 301 outputs the mode designating signal which causes the boost mode of the charge pump 2 to be switched to the middle power mode.

In order to, when the amplitude of the output voltage VOUT is increased, detect surely and rapidly the risk of causing waveform distortion in the output voltage VOUT, the circuits which generate the mode up signals MU1, MU3 (the circuits which perform determination regarding mode up conditions 1 and 3) are disposed, in addition to those which generate the mode up signals MU2, MU4 (the circuits which perform determination regarding mode up conditions 2 and 4).

A successive approximation A/D converter 330 is a circuit which is disposed for producing threshold voltages +Vdwn, −Vdwn that are used in s determination whether the above-described mode down condition is satisfied or not. In the case where the output voltage VOUT is lower than the threshold voltage +Vdwn, a comparator 331 sets a voltage detection signal VD1 to an active level, and, in the case where the output voltage VOUT is higher than the threshold voltage −Vdwn, a comparator 332 sets a voltage detection signal VD2 to an active level. When both the voltage detection signals VD1, VD2 are at the active level, the absolute value of the output voltage VOUT is smaller than a threshold voltage |Vdwn|.

In the state where the charge pump 2 operates in the middle power mode, when both the voltage detection signals VD1, VD2 are maintained at the active level for a predetermined time period or longer, the mode controlling section 301 outputs a mode designating signal which causes the boost mode of the charge pump 2 to be switched to the low power mode.

The embodiment is characterized in that the successive approximation A/D converter 330 functions as a threshold setting unit which, based on the output voltage VOUT of the amplifying section 1 at the mode up, sets the threshold voltages +Vdwn, −Vdwn constituting conditions for the mode down. Hereinafter, the configuration of the successive approximation A/D converter 330 will be described.

The successive approximation A/D converter 330 is a circuit which, under the control of the mode controlling section 301, samples and holds the output voltage VOUT of the amplifying section 1 at the mode up, to convert the voltage to a binary code, and which, by using the binary code, generates the threshold voltages +Vdwn, −Vdwn having a value that is slightly smaller than the output voltage VOUT of the amplifying section 1 at the mode up.

As illustrated, the successive approximation A/D converter 330 has a D/A converter 340, a data updating section 350, switches 361 to 365, capacitors 371, 372, and a comparator 380.

The D/A converted 340 is a circuit which converts an N-bit (N is an integer of 2 or more) binary code output from the data updating section 350, to the threshold voltages +Vdwn, −Vdwn in an analog form having the same absolute value, and which outputs the threshold voltages. The internal configuration of the D/A converter 340 will be described later.

The switches 361, 362, 363 are inserted respectively between a node to which the D/A converter 340 outputs the threshold voltage +Vdwn, that to which the D/A converter outputs the threshold voltage −Vdwn, and that to which the amplifying section 1 outputs the output voltage VOUT, and one electrode of the capacitor 371. The other electrode of the capacitor 371 is connected to the non-inverting input terminal of the comparator 380, and grounded through the switch 364. One electrode of the capacitor 372 is grounded. The other electrode of the capacitor 372 is connected to the inverting input terminal of the comparator 380, and grounded through the switch 365.

The ON/OFF states of the switches 361 to 365 are switched by the mode controlling section 301. More specifically, in the low power mode, the mode controlling section 301 sets the switches 361, 362 to the OFF state, and the switches 363, 364 to the ON state to apply the output voltage VOUT of the amplifying section 1 to the capacitor 371, and 0 V to the capacitor 372 (a sample operation).

When one of the above-described mode up signals MU1, MU2, MU3, MU4 is set to the active level, the mode controlling section 301 performs the mode up for switching the boost mode of the charge pump 2 to the middle power mode, and also the following controls.

First, the mode controlling section 301 sets the switches 363, 364, 365 to the OFF state, thereby causing the capacitor 371 to hold the output voltage VOUT of the amplifying section 1 at the mode up, and the capacitor 372 to hold 0 V.

In the case where the mode up signal MU1 or MU2 is set to the active level, and the mode up is performed (i.e., in the case where, when the amplifying section 1 outputs the positive output voltage VOUT, the mode up is performed), the mode controlling section 301 switches the switch 361 from the OFF state to the ON state, gives the threshold voltage +Vdwn output from the D/A converter 340 to the one electrode of the capacitor 371, and instructs the data updating section 350 to start the updating control of the N-bit binary code. As a result, the input voltage applied to the non-inverting input terminal of the comparator 380 is +Vdwn−VOUT. In accordance with a predetermined algorithm, based on the output signal of the comparator 380, the data updating section 350 controls the updating of the binary code so that the input voltage applied to the non-inverting input terminal of the comparator 380 becomes 0 V (i.e., the absolute value of the threshold voltage +Vdwn output from the D/A converter 340 coincides with that of the output voltage VOUT held in the capacitor 371). The contents of the updating control of the binary code are similar to those used in a well-known successive approximation A/D converter.

By contrast, in the case where the mode up signal MU3 or MU4 is set to the active level, and the mode up is performed (i.e., in the case where, when the amplifying section 1 outputs the negative output voltage VOUT, the mode up is performed), the mode controlling section 301 switches the switch 362 from the OFF state to the ON state, gives the threshold voltage −Vdwn output from the D/A converter 340 to the one electrode of the capacitor 371, and instructs the data updating section 350 to start the updating control of the N-bit binary code. As a result, the input voltage applied to the non-inverting input terminal of the comparator 380 is −Vdwn−VOUT. In accordance with a predetermined algorithm, based on the output signal of the comparator 380, the data updating section 350 controls the updating of the binary code so that the input voltage applied to the non-inverting input terminal of the comparator 380 becomes 0 V (i.e., the absolute value of the threshold voltage −Vdwn output from the D/A converter 340 coincides with that of the output voltage VOUT held in the capacitor 371).

After the updating control of the binary code is ended, and the threshold voltages +Vdwn, −Vdwn in which the absolute value is equal to the output voltage VOUT held in the capacitor 371 are output from the D/A converter 340, the data updating section 350 decrements the binary code by a predetermined value. As a result, the absolute value of the threshold voltages +Vdwn, −Vdwn which are supplied from the D/A converter 340 to the comparators 331, 332 is slightly smaller than the output voltage VOUT of the amplifying section 1 at the mode up.

Next, the configuration of the D/A converter 340 will be described. In the D/A converter 340, a power supply voltage +VA is applied to the sources of P-channel MOSFETs (Metal Oxide Semiconductor Field Effect transistors, hereinafter, a MOSFET is referred to simply as a transistor) 341, 342, 343, and the gates of the transistors are connected to the drain of the P-channel transistor 341. The power supply voltage +VA is used by the charge pump 2 in order to produce the positive and negative power supply voltages +VB, −VB.

A variable current source 344 is interposed between the drain of the P-channel transistor 341 and a ground line. The variable current source 344 is configured by: an N number of constant current sources in each of which, for example, the current value is $2^{-k} \cdot IO$ (k=1 to N); and an N number of switches each of which, in accordance with the bits of the N-bit binary code output from the data updating section 350, switches whether the respective one of the constant current sources is connected to the drain of the P-channel transistor 341 or not. The reference current value IO is, for example, a predetermined current value converted from a maximum value of an output current of the variable current source 344. The output current of the variable current source 344 flows to the P-channel transistor 341.

The negative power supply voltage −VB is given to the sources of N-channel transistors 345, 346, and the gates are connected to the drain of the N-channel transistor 345. The drain of the N-channel transistor 345 is connected to the drain of the P-channel transistor 342, so that the drain current of the P-channel transistor 342 flows to the N-channel transistor 345.

The P-channel transistors 342, 343 constitute, together with the P-channel transistor 341, a current mirror. The N-channel transistor 346 constitutes, together with the N-channel transistor 345, a current mirror. In the embodiment, the transistor sizes of the P-channel transistors 341 to 343 and the N-channel transistors 345, 346 are determined so that drain currents which are proportional to the output current of the variable current source 344, and which have the same degree flow to the P-channel transistor 343 and the N-channel transistor 346.

Resistors 347, 348 of the same resistance are interposed in series between the drain of the P-channel transistor 343 and that of the N-channel transistor 346. The common node of the resistors 347, 348 is grounded. The voltage of the drain of the P-channel transistor 343 is output as the threshold voltage +Vdwn, and that of the drain of the N-channel transistor 346 is output as the threshold voltage −Vdwn.

Here, the drain currents which are proportional to the output current of the variable current source 344, and which have the same degree flow to the P-channel transistor 343 and the N-channel transistor 346, and therefore the threshold voltages +Vdwn, −Vdwn which are proportional to the value indicated by the binary code output from the data updating section 350, and which have the same absolute value are obtained.

In the above, the configuration of the D/A converter 340 has been described in detail.

Figure 2:
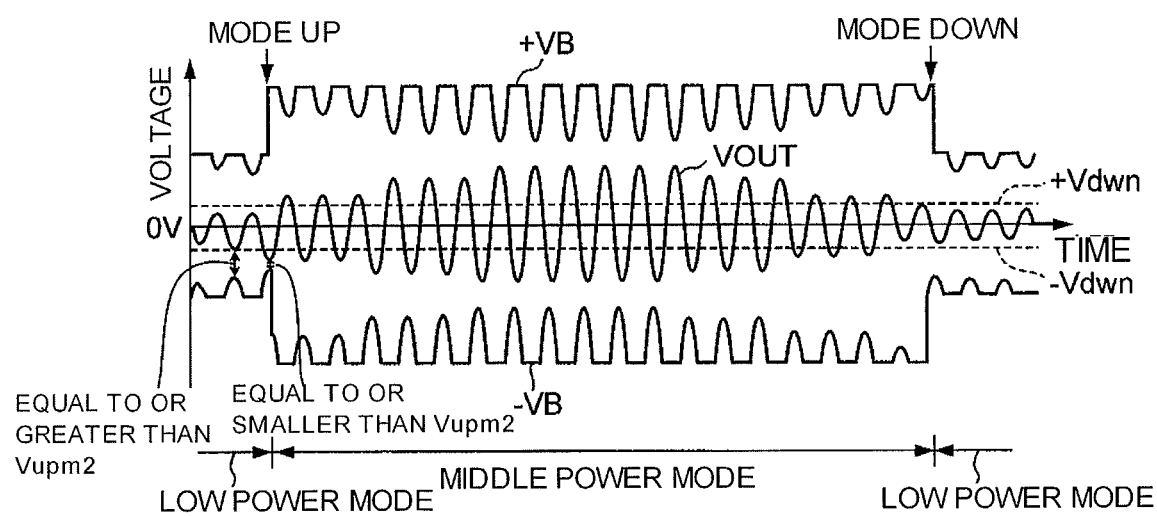
FIG. 2 is a time chart showing a first operation example in the case where conditions for determination regarding the mode down are supposedly fixed in the embodiment.
Figure 3:
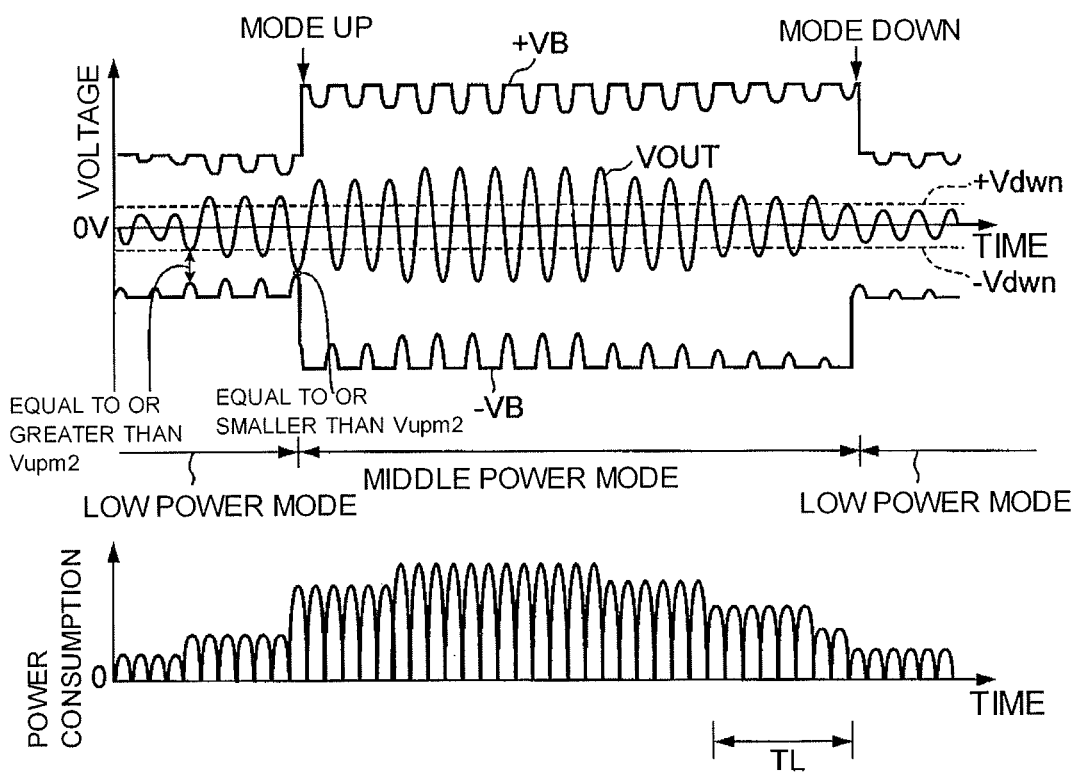
FIG. 3 is a time chart showing a second operation example in the case where a threshold voltage used in determination regarding the mode down is supposedly fixed in the embodiment.
Figure 4:
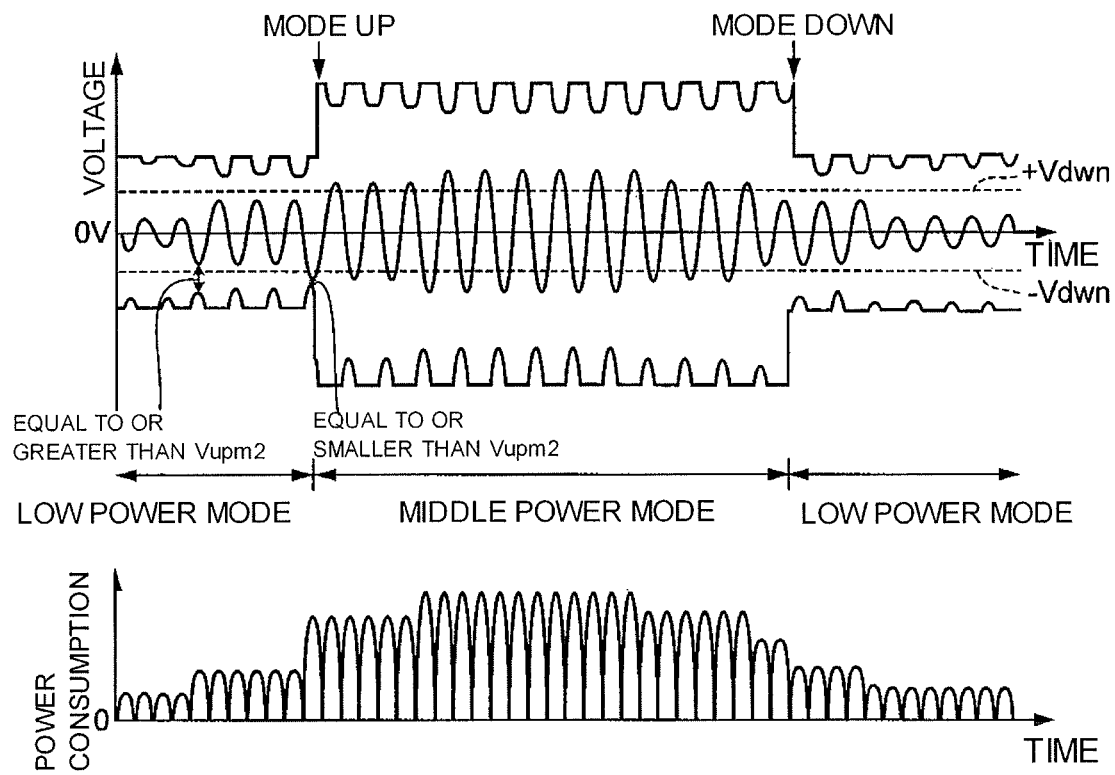
FIG. 4 is a time chart showing an operation example in the case where the threshold voltage used in determination regarding the mode down is controlled based on an output voltage of an amplifying section in the mode up in the embodiment.

FIGS. 2 and 3 are time charts showing operation examples in the case where, in the embodiment, it is supposed that the threshold voltages +Vdwn, −Vdwn are not controlled, but fixed. FIG. 2 shows an operation example in the case where the load resistance of the load 1A is small, and FIG. 3 shows that in the case where the load resistance of the load 1A is large. FIG. 4 is a time chart showing an operation example in the case where, in the embodiment, the threshold voltages +Vdwn, −Vdwn are variably controlled based on the output voltage VOUT at the mode up. Hereinafter, the function and effects of the embodiment will be described with reference to the figures.

When the amplifying section 1 outputs the positive output voltage VOUT, the load current flows from the output terminal for the positive power supply voltage +VB in the charge pump 2, to the ground line through the amplifying section 1 and the load 1A. In this case, when the absolute value of the output voltage VOUT is increased, the load current becomes larger, and the voltage drop across the output impedance of the charge pump 2 becomes larger, so that the positive power supply voltage +VB applied to the amplifying section 1 is lowered. When the amplifying section 1 outputs the negative output voltage VOUT, the load current flows from the ground line to the output terminal for the negative power supply voltage −VB in the charge pump 2 through the load 1A and the amplifying section 1. In this case, when the absolute value of the output voltage VOUT is increased, the load current becomes larger, and therefore the negative power supply voltage NB applied to the amplifying section 1 is raised. FIGS. 2 to 4 show the manners in which, in the case where the amplifying section 1 outputs a sinusoidal output voltage VOUT which swings about the ground potential 0V, the positive power supply voltage +VB is lowered correspondingly to the increase of the absolute value of the positive output voltage VOUT, and the negative supply voltage −VB is lowered correspondingly to the increase of the absolute value of the negative output voltage VOUT.

When the amplifying section 1 outputs the positive output voltage VOUT, a power which is equal to a multiplication of the positive power supply voltage +VB by the load current is consumed by the amplifying section 1 and the load 1A. When the amplifying section 1 outputs the negative output voltage VOUT, a power which is equal to a multiplication of the negative power supply voltage −VB by the load current is consumed by the amplifying section 1 and the load 1A. FIGS. 3 and 4 show the waveform of the power consumption in the amplifying section 1 and the load 1A.

When, in the low power mode, the amplitude of the output voltage VOUT of the amplifying section 1 is increased, the margin (difference) between the peak value of the positive output voltage VOUT and the positive power supply voltage +VB, or that between the peak value of the negative output voltage VOUT and the negative power supply voltage −VB is lost, and distortion occurs in the waveform of the output voltage VOUT. In the embodiment, when one of the mode up conditions 1 to 4 is satisfied, therefore, the mode controlling section 301 performs the mode up in which the charge pump 2 is switched from the low power mode to the middle power more, in order prevent waveform distortion from occurring in the output voltage VOUT. In the operation examples shown in FIGS. 2 to 4, in the low power mode, the margin (difference) between the output voltage VOUT and the negative power supply voltage −VB is smaller than the threshold voltage Vupm2, the mode up condition 4 is satisfied, and the mode up of switching from the low power mode to the middle power mode is performed.

In the middle power mode, the absolute value of the positive and negative power supply voltages +VB, −VB which are applied to the amplifying section 1 is twice that in the low power mode, and therefore it is possible to avoid waveform distortion from occurring in the output voltage VOUT. In the middle power mode, however, the power consumption of the amplifying section 1 is large. In the case where the amplitude of the output voltage VOUT is lowered, and, even if switching to the low power mode is performed, waveform distortion does not occur in the output voltage VOUT, therefore, it is preferred to perform switching to the low power mode without delay, in order to suppress the power consumption of the whole class-G amplifier. In the examples of FIGS. 2 and 3, in the middle power mode, therefore, the output voltage VOUT of the amplifying section 1 is compared with the fixed threshold voltages +Vdwn, −Vdwn, and, in the case where the output voltage VOUT maintains a value which is within a range from +Vdwn to −Vdwn for a predetermined time period or longer, the mode down in which the charge pump 2 is switched from the middle power mode to the low power mode is performed.

There is the following relationship between the positive and negative power supply voltages +VB, −VB which are given from the charge pump 2 to the amplifying section 1, and the output voltage VOUT of the amplifying section 1. First, in the case where the ON resistance of a switch in the charge pump 2 is large because of influences caused by production dispersions among elements constituting the charge pump 2, variations of the power supply voltages for the charge pump 2, and the temperature, even when the amplitude of the output voltage VOUT of the amplifying section 1 is small, and the load current is small, the absolute value of the positive and negative power supply voltages +VB, −VB output from the charge pump 2 is largely reduced. When the amplitude of the output voltage VOUT of the amplifying section 1 is small, therefore, one of the mode up conditions 1 to 4 is satisfied, and the mode up is performed. By contrast, in the case where the ON resistance of a switch in the charge pump 2 is small, even when the amplitude of the output voltage VOUT of the amplifying section 1 is large, and the load current is large, the reduction of the absolute value of the positive and negative power supply voltages +VB, −VB output from the charge pump 2 is small. Until the amplitude of the output voltage VOUT of the amplifying section 1 is large as compared with the case where the ON resistance of a switch in the charge pump 2 is large, any of the mode up conditions is not satisfied, and the mode up is not performed.

The relationship between the positive and negative power supply voltages +VB, −VB which are given from the charge pump 2 to the amplifying section 1, and the output voltage VOUT of the amplifying section 1 depends also on the load 1A connected to the amplifying section 1. In the example shown in FIG. 2, the load resistance of the load 1A is small. Even when the amplitude of the output voltage VOUT of the amplifying section 1 is small, therefore, a large load current flows to the load 1A through the amplifying section 1, and the absolute value of the positive and negative power supply voltages +VB, −VB output from the charge pump 2 is largely reduced. When the amplitude of the output voltage VOUT of the amplifying section 1 is small, therefore, one of the mode up conditions 1 to 4 is satisfied, and the mode up is performed. By contrast, as in the example shown in FIG. 3, in the case where the load resistance of the load 1A is large, even when the amplitude of the output voltage VOUT of the amplifying section 1 is large, a large load current does not flow to the load 1A, and the reduction of the absolute value of the positive and negative power supply voltages +VB, −VB output from the charge pump 2 is small. Until the amplitude of the output voltage VOUT of the amplifying section 1 is large as compared with the case where the load resistance of the load 1A is small, any of the mode up conditions is not satisfied, and the mode up is not performed.

As described above, when one of the mode up conditions is satisfied, the amplitude of the output voltage VOUT of the amplifying section 1 depends on production dispersions among elements constituting the charge pump 2, variations of the power supply voltages for the charge pump 2, the temperature, and the load resistance of the load 1A.

When the threshold voltage Vdwn which is used in determination regarding the mode down is large, therefore, the positive and negative power supply voltages +VB, −VB after the mode down, or the relationship between the voltages and the output voltage VOUT of the amplifying section 1 satisfies one of the mode up conditions 1 to 4, depending on production dispersions among elements constituting the charge pump 2, variations of the power supply voltages for the charge pump 2, the temperature, or the load resistance of the load 1A, and the mode up is performed. In this case, in the class-G amplifier, the mode up and the mode down are alternately repeated on the charge pump 2, and rapid changes of the positive and negative power supply voltages +VB, −VB at the mode up or the mode down are transmitted to a headphone which is the load 1A, to be output as noise.

In order to prevent such a trouble from occurring, the threshold voltage Vdwn which is used in determination regarding the mode down must be set to a sufficiently low voltage so that one of the mode up conditions 1 to 4 is not satisfied after the mode down, while considering all factors such as production dispersions among elements constituting the charge pump 2, variations of the power supply voltages for the charge pump 2, the temperature, and the load resistance of the load 1A.

When the threshold voltage Vdwn which is used in determination regarding the mode down is set to a low voltage, there occurs a situation where, although, even when the mode down is performed, the waveform distortion is not caused in the output voltage VOUT because there is the margin (difference) between the peak value of the output voltage VOUT and the power supply voltage, the mode down is not performed, and the duration time period of the middle power mode is wastefully prolonged, thereby causing a problem in that the power consumption is increased.

As apparent from a comparison of FIGS. 2 and 4, for example, the amplitude (FIG. 3) of the output voltage VOUT which is generated in the mode up in the case where the load resistance of the load 1A is larger than the amplitude (FIG. 2) of the output voltage VOUT which is generated in the mode up in the case where the load resistance of the load 1A is small. In order to prevent the above-described repetition of the mode up and the mode down from occurring, therefore, it is contemplated that the threshold voltages +Vdwn, −Vdwn are set to have an absolute value which is slightly smaller than the amplitude (FIG. 2) of the output voltage VOUT which is generated in the mode up in the case where the load resistance of the load 1A is small. When the mode down is performed in the case where the threshold voltages +Vdwn, −Vdwn are set in this way, and the output voltage VOUT of the amplifying section 1 maintains a voltage value within the range from +Vdwn to −Vdwn for a predetermined time period or longer, a phenomenon where the mode up is performed immediately after the mode down can be avoided from occurring, in both the cases where the load resistance of the load 1A is small, and where the load resistance of the load 1A is large.

In the case where the load resistance of the load 1A is large (FIG. 3), when the threshold voltages +Vdwn, −Vdwn are set in this way, however, the following phenomenon occurs. Even though the amplitude of the output voltage VOUT of the amplifying section 1 is sufficiently smaller than that of the output voltage VOUT at the mode up, and a situation is attained where, even when the mode down is performed, the above-described repetition of the mode up and the mode down does not occur, the mode down is not performed, and a time period L when a large electric power is wastefully consumed occurs.

In the embodiment, therefore, the following procedures are performed. As exemplified in FIG. 4, the output voltage VOUT of the amplifying section 1 at the mode up is obtained, the threshold voltages +Vdwn, −Vdwn having an absolute value which is slightly smaller than the amplitude of the output voltage VOUT at the mode up are set, and, in the case where, in the middle power mode, the output voltage VOUT maintains a voltage value within the range from +Vdwn to −Vdwn for a predetermined time period or longer, the mode down from the middle power mode to the low power mode is performed.

According to the embodiment, even when the output voltage VOUT which is generated at the mode up is changed because of influences caused by production dispersions among elements constituting the charge pump 2, variations of the power supply voltages for the charge pump 2, the temperature, and the load resistance of the load 1A, adequate threshold voltages +Vdwn, −Vdwn corresponding to the output voltage VOUT at the mode up are set for determination regarding the mode down. According to the embodiment, while avoiding the repetition of the mode up and the mode down, therefore, adequate threshold voltages +Vdwn, −Vdwn for determination regarding the mode down can be set, a situation where the middle power mode is wastefully continued can be avoided, and the power consumption can be reduced.

Although the embodiment of the invention has been described, other embodiments may be possible within the scope of the invention. For example, the following embodiments may be employed.

(1) In the above-described embodiment, the charge pump having the two boost modes, or the low power mode and the middle power mode is used as the power supply for the class-G amplifier. However, the power supply control circuit of the invention may be applied to a class-G amplifier in which a charge pump having three or more boost modes is used as a power supply. In the case where the charge pump has a low power mode, a middle power mode, and a high power mode, for example, the power supply control circuit may set a threshold voltage functioning as conditions for the mode down from the middle power mode to the low power mode, based on the output voltage of the amplifying section at the mode up from the low power mode to the middle power mode. Furthermore, the power supply control circuit may set a threshold voltage functioning as conditions for a mode down from the high power mode to the middle power mode, based on the output voltage of the amplifying section in a mode up from the middle power mode to the high power mode.

(2) In the above-described embodiment, when one of the mode up conditions 1 to 4 is satisfied, the mode up is performed. Alternatively, the mode up conditions 1 and 3 may be omitted, and, when one of the mode up conditions 2 and 4 is satisfied, the mode up may be performed. Alternatively, the mode up conditions 2 and 4 may be omitted, and, when one of the mode up conditions 1 and 3 is satisfied, the mode up may be performed.

(3) In the above-described embodiment, the power supply voltages +VB, −VB generated by the charge pump 2 are switched based on the output voltage VOUT of the amplifying section 1. Alternatively, for example, a charge pump which generates a positive power supply voltage +VB1=+VDD/2 and negative power supply voltage −VB1=−VDD/2 for the low power mode, and a positive power supply voltage +VB2=+VDD and negative power supply voltage −VB2=−VDD for the middle power mode may be disposed, and switching whether a set of the positive and negative power supply voltages +VB1, −VB1, or that of a set of the positive and negative power supply voltages +VB2, −VB2 is supplied to the amplifying section 1 may be performed based on the output voltage VOUT of the amplifying section 1.

(4) In the above-described embodiment, the charge pump is used as a power supply for the amplifying section 1. Alternatively, a power supply other than a charge pump may be used.

[Description of Reference Numerals and Signs]
1 . . . amplifying section, 1A . . . load, 2 . . . charge pump, 3, 3A . . . power supply control circuit, 311, 314, 321, 324, 331, 332, 380 . . . comparator, 312, 322, 347, 348 . . . resistor, 313, 323 . . . constant current source, 330 . . . successive approximation A/D converter, 340 . . . D/A converter, 350 . . . data updating section, 361 to 365 . . . switch, 371, 372 . . . capacitor, 341 to 343 . . . P-channel transistor, 345, 346 . . . N-channel transistor, 344 . . . variable current source, 301 . . . mode controlling section

What is claimed is:

1. A power supply control circuit comprising:
a mode controlling unit which, in accordance with an output voltage of an amplifying section, performs a mode up for switching a current power supply voltage of the amplifying section to a higher power supply voltage being higher than the current power supply voltage, and which, in a case where a magnitude of the output voltage of the amplifying section is smaller than a threshold voltage for a predetermined time period or longer, performs a mode down for switching the power supply voltage of the amplifying section to a lower power supply voltage being lower than the current power supply voltage; and
a threshold setting unit which holds the output voltage of the amplifying section at a timing when the mode up is performed, and sets the threshold voltage based on the held output voltage of the amplifying section.

2. The power supply control circuit according to claim 1, wherein the amplifying section receives a supply of a positive power supply voltage and a negative power supply voltage, and outputs positive and negative output voltages as the output voltage; and
wherein in a case where the output voltage of the amplifying section approaches the positive power supply voltage or the negative power supply voltage so that a difference between the output voltage and the positive power supply voltage or the negative power supply voltage is smaller than a predetermined limit value, the mode controlling unit performs the mode up.

3. The power supply control circuit according to claim 1, wherein the amplifying section receives a supply of a positive power supply voltage and a negative power supply voltage, and outputs positive and negative output voltages as the output voltage; and
wherein in a case where the positive power supply voltage is smaller than a predetermined upper threshold value or the negative power supply voltage is higher than a predetermined lower threshold value, the mode controlling unit performs the mode up.

4. The power supply control circuit according to claim 1, wherein the amplifying section receives a supply of a positive power supply voltage and a negative power supply voltage, and outputs positive and negative output voltages as the output voltage; and wherein in a case where the output voltage of the amplifying section approaches the positive power supply voltage or the negative power supply voltage so that a difference between the output voltage and the positive power supply voltage or the negative power supply voltage is smaller than a predetermined limit value, or where an absolute value of the positive power supply voltage or the negative power supply voltage is smaller than a predetermined value, the mode controlling unit performs the mode up.

5. The power supply control circuit according to claim 1, wherein the threshold setting unit sets a voltage whose absolute value is smaller by a predetermined amount than the output voltage of the amplifying section at the timing when the mode up is performed, as the threshold voltage.

6. The power supply control circuit according to claim 5, wherein the threshold setting unit, in accordance with a signal from the mode controlling unit, samples and holds the output voltage of the amplifying section at the timing when the mode up is performed, converts the held output voltage to a binary code, and generates the voltage whose absolute value is smaller by the predetermined amount than the output voltage of the amplifying section at the timing when the mode up is performed by using the binary code to set the generated output voltage as the threshold voltage.

7. The power supply control circuit according to claim 6, wherein the threshold setting unit includes:
   a digital-analog converter which converts the binary code to the threshold voltage in an analog form, and which outputs the threshold voltage;
   a plurality of switches which are respectively turned on or off under control of the mode controlling unit;
   a capacitor which is selectively connected to one of an output of the digital-analog converter and an output of the amplifying section by the plurality of switches;
   a comparator which has an input terminal connected to the capacitor; and
   a data updating section which controls an updating of the binary code so that the threshold voltage output from the digital-analog converter coincides with the output voltage held in the capacitor; and
   wherein the data updating section decrements the binary code by a predetermined value after an updating process of the binary code is ended and the threshold voltage based on the updated binary code is output from the digital-analog converter.

* * * * *